(12) United States Patent
Bhatia et al.

(10) Patent No.: US 10,303,364 B2
(45) Date of Patent: May 28, 2019

(54) TECHNIQUES FOR LOW-LATENCY CHASE DECODING OF TURBO PRODUCT CODES WITH SOFT INFORMATION

(71) Applicant: SK Hynix Inc., Gyeonggi-do (KR)

(72) Inventors: Aman Bhatia, San Jose, CA (US); Yi-Min Lin, San Jose, CA (US); Naveen Kumar, San Jose, CA (US); Fan Zhang, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/431,561

(22) Filed: Feb. 13, 2017

(65) Prior Publication Data

US 2017/0279463 A1    Sep. 28, 2017

Related U.S. Application Data

(60) Provisional application No. 62/313,323, filed on Mar. 25, 2016.

(51) Int. Cl.
| | |
|---|---|
| *H03M 13/15* | (2006.01) |
| *G06F 3/06* | (2006.01) |
| *H03M 13/29* | (2006.01) |
| *H03M 13/00* | (2006.01) |
| *H03M 13/45* | (2006.01) |

(52) U.S. Cl.
CPC .......... *G06F 3/0608* (2013.01); *G06F 3/064* (2013.01); *G06F 3/0652* (2013.01); *G06F 3/0679* (2013.01); *H03M 13/152* (2013.01); *H03M 13/2963* (2013.01); *H03M 13/453* (2013.01); *H03M 13/6502* (2013.01)

(58) Field of Classification Search
CPC .................................................. H03M 13/2957

USPC ......................................... 714/755, 757, 752
See application file for complete search history.

(56) References Cited

U.S. PATENT DOCUMENTS

| | | | |
|---|---|---|---|
| 6,460,162 B1 | 10/2002 | Buda et al. | |
| 9,170,876 B1* | 10/2015 | Bates ................. | G06F 11/1048 |
| 9,231,623 B1 | 1/2016 | Kumar et al. | |
| 2009/0249165 A1* | 10/2009 | Gracie ................ | H03M 13/296 |
| | | | 714/758 |
| 2014/0006896 A1 | 1/2014 | Wu | |
| 2014/0015697 A1 | 1/2014 | Wu | |
| 2014/0351672 A1 | 11/2014 | Marrow et al. | |

OTHER PUBLICATIONS

Obaid UR Rehman, "Impact of Bit-Flip Combinations on Successive Soft Input Decoding of Reed Solomon Codes" The Fourth International Conference on Communication Theory, Reliability, and Quality of Service, 2011, 5 pages.
David Chase "A Class of algorithms for decoding block codes with channel measurement information" IEEE Transactions on Information Theory, 1972, 13 pages.

* cited by examiner

*Primary Examiner* — Fritz Alphonse
(74) *Attorney, Agent, or Firm* — Kilpatrick Townsend & Stockton LLP

(57) ABSTRACT

Techniques are described for decoding a first message. In one example, the techniques include obtaining a second message comprising reliability information corresponding to each bit in the first message, performing a soft decision decoding procedure on the second message to generate a decoded codeword, wherein the soft decision decoding procedure comprises a joint decoding and miscorrection avoidance procedure, and outputting the decoded codeword.

20 Claims, 8 Drawing Sheets

TECHNIQUES FOR LOW-LATENCY CHASE DECODING OF TURBO PRODUCT CODES WITH SOFT INFORMATION

CROSS-REFERENCE TO RELATED APPLICATIONS

The present application claims priority to Provisional Application No. 62/313,323 entitled "Low-Latency Chase Decoding Of Turbo Product Codes With Soft Information," filed Mar. 25, 2016, which is assigned to the assignee hereof and expressly incorporated by reference herein in its entirety.

TECHNICAL FIELD

The present disclosure relates generally to error correcting codes, and in particular, to efficient decoding of Turbo Product Codes.

BACKGROUND

Error Control Coding (ECC) schemes are essential in data storage applications to provide data integrity. For NAND flash memories, different ECC schemes including low-density parity-check (LDPC) codes, Bose-Chaudhuri-Hocquenghem (BCH) codes and turbo product codes (TPCs) can be used. TPC codes can provide low data failure rates compared to other state of the art codes when a single read information is available from the NAND flash memory (e.g., hard decision decoding). However, in some scenarios, when soft information is available from the NAND flash memory, LDPC codes may provide better decoding results. Turbo product codes may also be decoded with a soft decision decoding algorithm, such as Chase(L) decoding algorithm. There is a need in the art to improve decoding performance of TPC codes when soft information is available at the decoder.

SUMMARY

In one embodiment, a method for decoding a first message is disclosed. The method includes, in part, obtaining a second message comprising reliability information corresponding to each bit in the first message, performing a soft decision decoding procedure on the second message to generate a decoded codeword. The soft decision decoding procedure includes a joint decoding and miscorrection avoidance procedure. The method further includes outputting the decoded codeword. In one example, the first message corresponds to a turbo product code codeword comprising at least one Bose-Chaudhuri-Hocquenghem (BCH) constituent code.

In one example, the joint Chase decoding and miscorrection avoidance procedure includes, in part, identifying a first plurality of least reliable bits in the first message, generating a plurality of flipped messages using the first message and the identified plurality of least reliable bits, and performing a hard decision decoding procedure on a first one of the plurality of flipped messages to find a first candidate codeword.

In one embodiment, the joint Chase decoding and miscorrection avoidance procedure further includes generating a combined metric for the first candidate codeword. The combined metric corresponds to a summation of absolute values of a first set of reliability values corresponding to the bits that are flipped in the candidate codeword. The combined metric may then be compared to a first threshold to determine whether the first candidate codeword is a valid codeword. In one embodiment, the combined metric is used to jointly select a correct codeword and identify miscorrection in the corresponding codeword.

In one embodiment, the method further includes performing an early termination of the soft decoding procedure by outputting the first candidate codeword as the decoded codeword as soon as the first valid codeword is found without decoding any of the remaining flipped messages.

In one embodiment, the hard decision decoding procedure is a hard decision Bose-Chaudhuri-Hocquenghem (BCH) decoding procedure.

In one embodiment, an apparatus for decoding a first message is disclosed. The apparatus includes a memory and at least one processor coupled to the memory. The at least one processor is configured to obtain a second message comprising reliability information corresponding to each bit in the first message, and perform a soft decision decoding procedure on the second message to generate a decoded codeword. The soft decision decoding procedure includes a joint decoding and miscorrection avoidance procedure. The apparatus is further configured to output the decoded codeword.

In one embodiment, a non-transitory processor-readable medium for decoding a first message is disclosed. The processor-readable medium includes, in part, processor-readable instructions configured to cause one or more processors to obtain a second message comprising reliability information corresponding to each bit in the first message, and perform a soft decision decoding procedure on the second message to generate a decoded codeword. The soft decision decoding procedure includes a joint decoding and miscorrection avoidance procedure. The processor-readable instructions are further configured to cause the one or more processors to output the decoded codeword.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
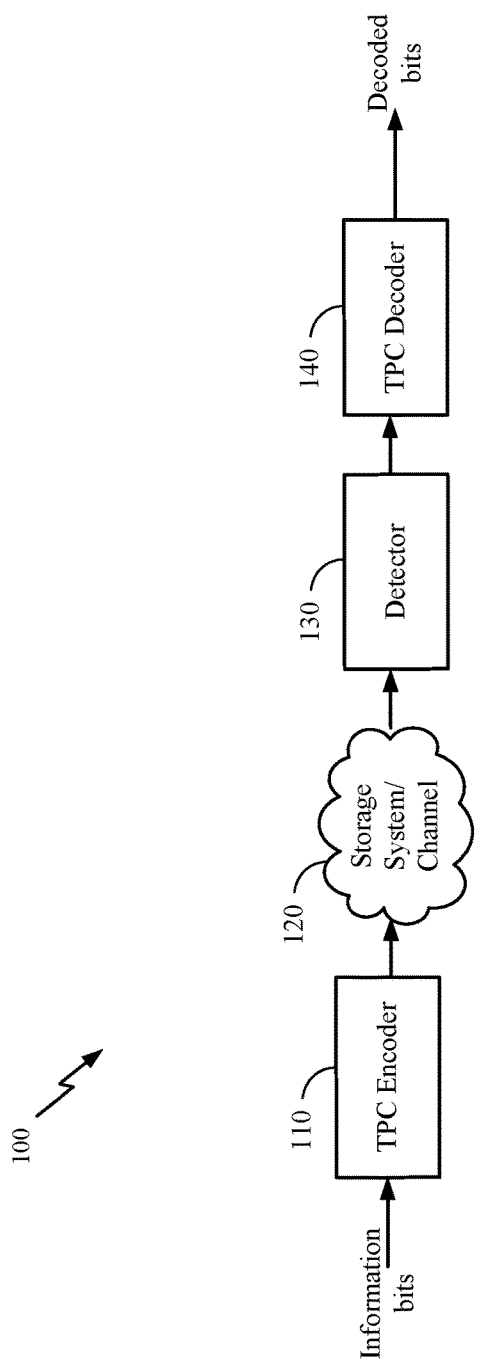
FIG. 1 illustrates an example high level block diagram of a turbo product code (TPC) error correcting system, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes may include turbo product codes (TPC), low density parity check codes (LDPC), Bose-Chaudhuri-Hocquenghem (BCH) codes, Reed Solomon codes, and the like.

Turbo product codes are a promising candidate for correcting errors in storage applications. Turbo product codes may include two or more dimensions, each of which corresponding to a class of error correcting codes, such as BCH codes, Reed Solomon codes, or the like. The ECC code corresponding to each dimension of the TPC code is referred to herein as a constituent code. In one example, a two-dimensional TPC codeword may include one or more error correcting codewords (e.g., BCH codewords) corresponding to its first dimension, and one or more error correcting codewords corresponding to its second dimension.

TPC codes may be decoded by performing an iterative decoding procedure on the constituent codewords in one or more dimensions. As an example, for decoding a TPC code with BCH constituent codes, the TPC decoder performs BCH decoding on one or more codewords in the first dimension and one or more codewords in the second dimension of the TPC code. The TPC decoder may iteratively continue the decoding process until either a correct codeword is found or decoding failure is declared.

The term "hard decision" is used herein to refer to a bit that comprises a "0" or a "1" value, and is associated with a particular location within a codeword. A "hard decision" may also be referred to as a "hard output" or "hard information." In some embodiments, the reliability of each hard decision may be known. The "reliability" of a hard decision refers to a probability (e.g., a value from "0" through "1") that the corresponding hard decision is correct. A "reliability" may also be referred to as "soft information" or a "soft output." In a NAND channel, a reliability for each bit may be obtained, for example, by multiple read operations from the NAND memory using different thresholds. In general, if the hard decision decoding of a codeword fails, soft information can be used to decode the failed codeword using soft decoding techniques, such as Chase decoding.

In TPC codes, miscorrection of the constituent codewords may result in performance degradation. The term miscorrection is used herein to refer to the cases in which the received codeword is closer to an incorrect codeword than the correct constituent codeword. In general, probability of miscorrection may be higher when number of errors in the received codeword (e.g., from the NAND flash memory) is large. This may occur, for example, when the soft information is not generated in an optimal manner, or when the distributions of the threshold of the cells in the NAND flash memory are unknown or difficult to determine, or when the NAND flash is close to its end-of-life. In some conventional systems, parity check bits are added—in addition to the parity generated by the code—to detect a miscorrection in a correctable codeword output by a decoder. For example, cyclic redundancy checks (CRC) can be added to the user data portion. The CRC checks together with the user data are protected by the main code. After decoding, CRC bits are checked. In one example, if the CRC check fails, a miscorrection is declared. Another conventional example is adding one or two single parity check bits to the codeword. In this scenario, if the decoded codeword does not satisfy the parity checks, miscorrection is declared. It should be noted that one disadvantage of these conventional techniques is the cost of extra overhead. Therefore, these techniques cannot be used in overhead-sensitive applications. As an example, a small amount of overhead is usually allowed for each constituent code in a TPC codeword in storage applications (e.g., BCH codes with small correction capability t are used). Therefore, such approaches are not suitable for detecting miscorrection in storage applications.

Certain embodiments disclose an efficient soft decoding procedure for decoding error correcting codes, such as BCH codes and/or TPC codes. In one embodiment, the disclosed method may be used to decode one or more of the constituent codewords in a TPC codeword. Although BCH codes are used as an example to explain the proposed method, the decoding procedure disclosed herein is not limited to decoding BCH codes and can be applied to any other class of error correcting codes. The soft decoding technique described herein performs joint Chase decoding and miscorrection detection/avoidance of codes to improve soft decoding performance of the TPC codes. In an earlier work, a miscorrection metric was determined based on soft information corresponding to a codeword. The miscorrection metric was then compared to a threshold to determine whether a miscorrection has happened or not. The proposed joint miscorrection metric can, in some scenarios, be computed with fewer reads from the memory and smaller hardware complexity than the previous work. In one embodiment, the proposed technique enables early termination of Chase decoding with minimal or no performance loss. In addition, the proposed technique provides significantly lower latency during soft decoding compared to other soft decoding architectures in the art. Furthermore, an adaptive decoder is described herein in which a first set of decoding parameters are used for a first number of decoding iterations and a second set of decoding parameters are used for a second number of decoding iterations. Details of the proposed techniques are discussed in the rest of this disclosure.

In some scenarios, soft decoding performance of TPC codes may not be as good as performance of other error correcting codes. One of the main reasons for performance degradation in TPC codes with soft decoding is miscorrection of the component codewords. As an example, a conventional soft information Chase decoder may perform poorly if miscorrections are not identified and/or avoided. To improve decoding performance of TPC codes, current techniques in the art perform Chase decoding separately followed by a miscorrection avoidance procedure. In particular, Chase decoding is performed on the component codewords of the TPC, where the least reliable bits are flipped and hard decoding is performed multiple times. The outputs of successful hard decoding procedures are sorted according to the Euclidean distance to the received codeword, and the closest codeword is selected as a candidate decoded codeword. This is usually followed by an additional procedure (e.g., miscorrection avoidance thresholding (MAT)) to determine whether the selected candidate codeword (e.g., output of the Chase decoder) is the correct codeword or if it is a miscorrected codeword. In one example, when a miscorrection is declared, no changes are made to the received codeword in that iteration of Chase decoding to avoid adding new errors in the codeword.

FIG. 1 illustrates an example high level block diagram of a TPC error correcting system, in accordance with certain embodiments of the present disclosure. In the example shown, TPC encoder 110 receives information bits that include data which is desired to be stored in a storage system 120 or transmitted in a communications channel. TPC encoded data is output by TPC encoder 110 and is written to storage 120. In various embodiments, storage 120 may include a variety of storage types or media, such as magnetic disk drive storage, Flash storage, etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested or otherwise desired (e.g., by an application or a user), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to TPC decoder 140 which performs TPC decoding using the decision and/or reliability information. A soft input decoder utilizes both the decision and the reliability information to decode the codeword. A hard decoder utilizes only the decision values in the decoder to decode the codeword. After decoding, the decoded bits generated by TPC decoder are passed to the appropriate entity (e.g., the user or application which requested it). With proper encoding and decoding, the information bits match the decoded bits.

Figure 2:
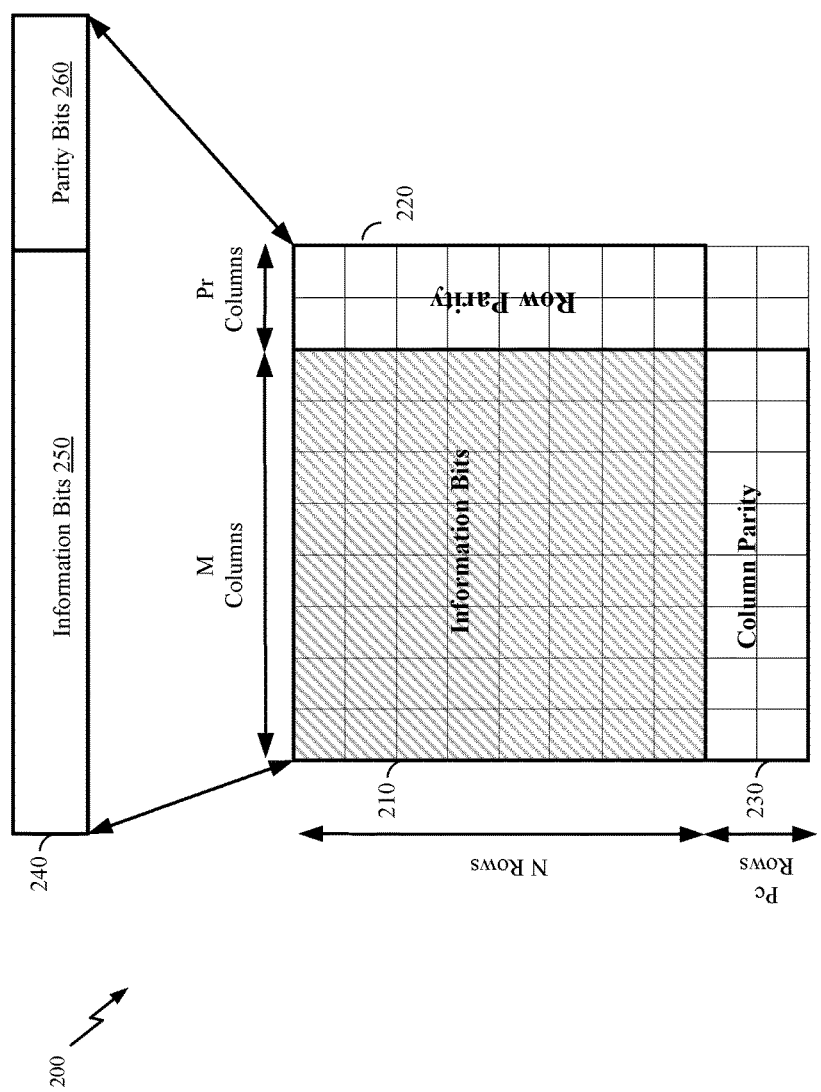
FIG. 2 illustrates an example block diagram of a TPC codeword, in accordance with certain embodiments of the present disclosure.

FIG. 2 illustrates an example block diagram of a two-dimensional TPC codeword 200, in accordance with certain embodiments of the present disclosure. As illustrated, the TPC codeword 200 may be a matrix of size $(N+P_c) \times (M+P_r)$, in which N represents number of rows of information bits, M represents number of columns of information bits, $P_r$ represents number of row parity bits, and $P_c$ represents number of column parity bits. Information bits can be represented by a matrix of size N×M (e.g., matrix 210), row parity bits can be represented by a matrix of size N×$P_r$ (e.g., matrix 220), and column parity bits may be represented by a matrix of size $P_c$×M (e.g., matrix 230). The TPC codeword may include N codewords corresponding to its first dimension (e.g., row codewords), and M codewords corresponding to its second dimension (e.g., column codeword). Each row codeword 240 includes multiple information bits 250 and one or more parity bits 260. Similarly, each column codeword includes multiple information bits and one or more parity bits. As an example, if BCH codes are used as row constituent codes, the row codewords 1 through N are constructed using BCH encoding. Similarly, column codewords 1 through M are generated using an error correcting constituent code (e.g., BCH code, Reed Solomon code, etc.).

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

Figure 3:
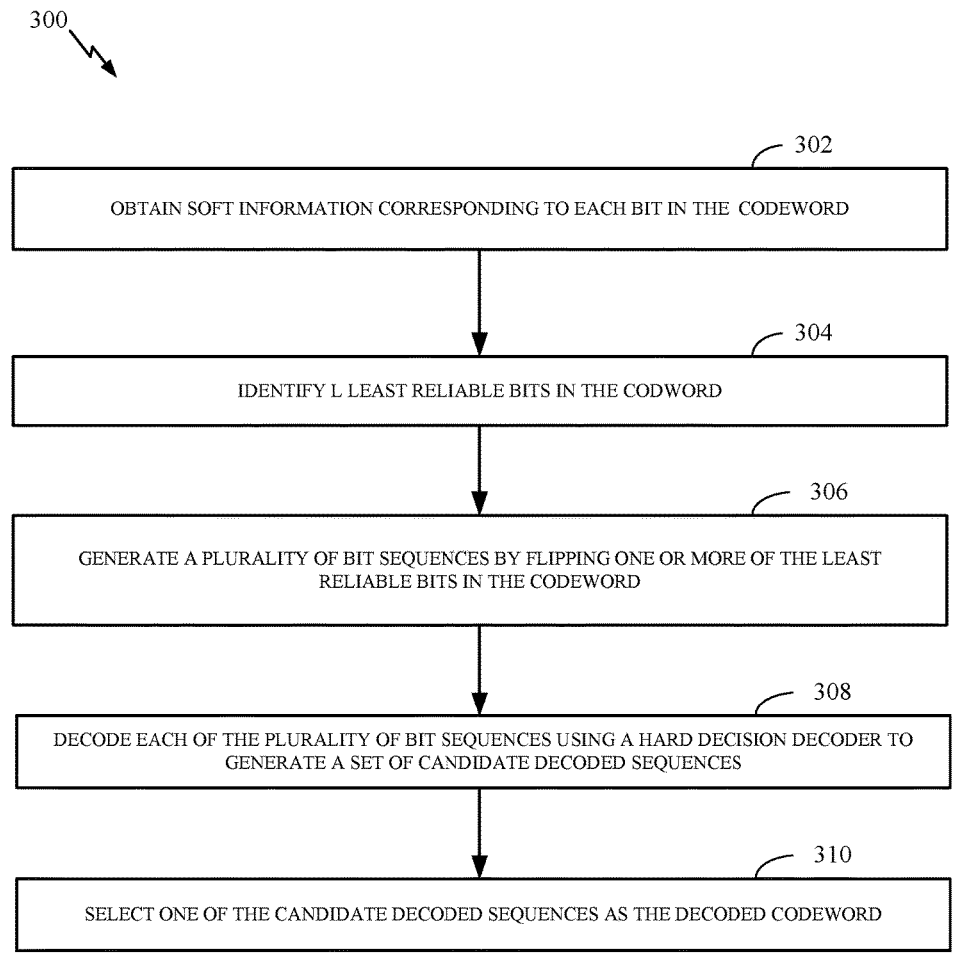
FIG. 3 illustrates a flow diagram describing an example process of decoding a codeword using Chase decoding algorithm, in accordance with certain embodiments of the present disclosure.

FIG. 3 is a flow diagram describing an example process of decoding a BCH codeword using a soft decision decoder. In this example, process 300 is implemented by a Chase(L) decoder. At 302, a first codeword corresponding to a plurality of information bits and a plurality of parity bits is received. Soft information (e.g., reliabilities) corresponding to each of the bits in the codeword are obtained. At 304, the set of reliabilities are used to identify the L locations of least reliable bits (LRBs) among the received bits. The parameter L can, in general, be selected to be any integer. In one embodiment, the choice of least reliable bit locations may be refined further using the information of syndromes of other component codewords that share these bits. At 306, all possible bit flip patterns of the L least reliable bits of the input set of hard decisions (e.g., the first codeword) are generated to form $2^L$ flipped bit sequences. For example, each bit sequence is generated by flipping one or more bits in the first codeword.

At 308, each of the flipped bit sequences are decoded using a hard decision decoding algorithm (e.g., BCH hard decoder) to generate a set of candidate decoded bit sequences. The flipped set of bit sequences can be represented as $K=\{k^{(j)}, j=0, 1, \ldots, 2^L-1\}$. Each of the set of $2^L$ bit sequences is fed into a hard decision error correction decoder. The hard decision error correction decoder then attempts to decode each of the $2^L$ bit sequences. For each decoding try, there are two possibilities: if the hard decision decoder deems the input bit sequence uncorrectable, that particular decoding attempt is discarded. If the hard decision decoder deems the input bit sequence correctable, the decoder will propose one or more bit flips to the input bit sequence.

Assuming that the hard decision error correction decoder is a BCH decoder with t=3, then the decoder can propose up to t locations of the correctable input bit sequence that need to be flipped. Note that the locations of the bit flips indicated by the hard decision decoder can be anywhere in the codeword, not just in the L least reliable locations. Set $X=\{\hat{x}^{(j)}, j=0, 1, \ldots, 1, \text{ where } 1 \leq 2^L\}$ represents the set of decoded bit sequences output by the hard decision decoder (e.g., which is in turn a part of the soft decision Chase decoder). Because not every bit sequence may be decodable, the number of decoded bit sequences l may be fewer than the total number of bit sequences, $2^L$. Furthermore, at least some of the decoded bit sequences of set X are not distinct since multiple bit sequences may be decoded to the same codeword. The decoded bit sequences of set X may be thought of as a list of "candidate codewords" or "candidate decoded bit sequences" from which one is to be selected and output by the Chase decoder.

At 310, a decoded bit sequence is selected from the set of candidate decoded bit sequences. The selected decoded bit sequence includes one or more proposed corrections corresponding to one or more of the received bits. If the decoded set X is empty, the codeword is uncorrectable. If X is not empty, one of the candidate codewords is selected from the set of candidate codewords to output from the Chase decoder as the decoded codeword. A metric is usually generated to compare different candidate decoded codewords and select one that is the most likely decoded codeword by comparing the candidate codewords to the received codeword. In general, any method may be used to select the decoded bit sequence without departing from the teachings of the present disclosure. For example, the decoded bit sequence is selected from set X such that it has the highest reliability. In another example, the metric $M_1$ is the Euclidean distance of the decoded component codeword from the received word:

$$M_1(c, r) = \sum_{i=1}^{N} (r_i - c_i)^2, \quad \text{Eqn (1)}$$

where c is the decoded component codeword, r is the received codeword, N is the codeword length. When all subsets are decoded and the candidate codewords are identified, one of the candidate codewords with minimum metric $M_1$ is selected.

The Euclidean metric is known to be optimal for minimizing the probability of miscorrection. However, computing the Euclidean distance requires reading the entire memory containing soft-information, as well as implementing the squaring operation in hardware. This causes high latency when bandwidth of the memory is limited as well as high hardware cost.

Note that one or more of the L least reliable locations of the input set of hard decisions were flipped at step 306. In addition, the hard decision decoder may also flip up to t more locations of the input set of hard decisions. Thus, each of the candidate decoded codewords of set X (including the selected decoded codeword) can differ from the set of input hard decisions in up to t+L locations. The up to t+L locations in which bits differ between the input set of hard decisions and the selected decoded codeword form the set of proposed corrections by the Chase decoder.

The correction capability of a Chase decoder increases with larger values of L, but the complexity of the Chase decoder also increases exponentially with L. Thus, in some embodiments, it is preferred to have a smaller value of L. Chase decoding can increase the miscorrection problem because, by flipping up to L of the received bits, errors can, in some cases, be added. It should be noted that a BCH hard decision decoder can also introduce at most t bit-errors into the codeword through miscorrection. Therefore, Chase(L) can add up to t+L errors into the codeword. Thus, it is very desirable to find a miscorrection avoidance technique with limited complexity overhead for soft decision decoding algorithms such as Chase decoding.

In one embodiment, a miscorrection metric may be determined based at least in part on one or more of the reliability values corresponding to the one or more of the input bits. The miscorrection metric can then be used to determine whether to output the selected bit sequence or declare a decoding failure status without outputting any codeword to avoid a potential miscorrection.

In one embodiment a joint Chase decoder with miscorrection avoidance technique is disclosed. The proposed decoder has a small latency and requires lower computations compared to other techniques in the art due to the use of a sub-optimal metric. The proposed metric requires less reads of the soft-information memory as well as lower hardware area for computation. Moreover, the proposed metric is reused for the thresholding comparison in miscorrection avoidance procedure. Therefore, the proposed joint Chase decoder and miscorrection avoidance procedure saves even more by eliminating the need for computing two separate metrics for the Chase decoding and the miscorrection avoidance.

As described herein, in one embodiment, Chase decoding and mis-correction avoidance are performed jointly to improve both decoding performance and throughput of the decoder, as well as reduce the hardware required to implement this decoder. In one embodiment, the comparison metric used in Chase decoding is modified such that the mis-correction avoidance block and the Chase decoder can share the computation. Moreover, calculation of the disclosed metric needs smaller hardware area as well as fewer reads of the memory in which soft information is stored.

It should be noted that while the disclosed joint Chase decoding and miscorrection avoidance scheme is discussed regarding TPC and BCH codes, the proposed method can be used to improve soft decoding of other ECC codes without departing from the teachings of the present disclosure.

Figure 4:
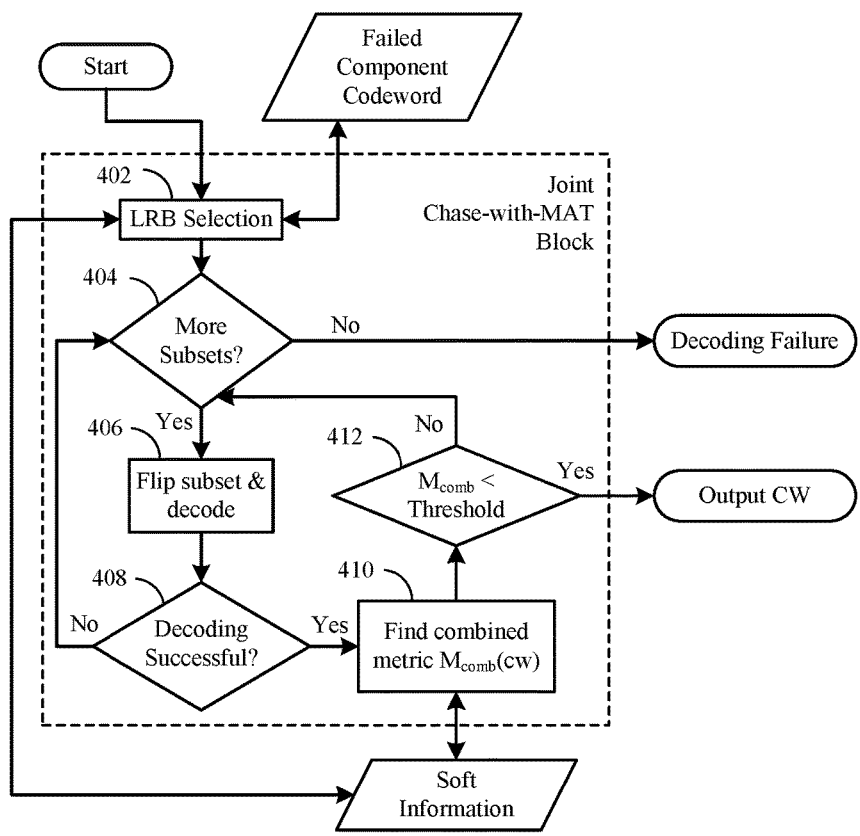
FIG. 4 illustrates a block diagram of a joint Chase decoding and miscorrection avoidance architecture, in accordance with certain embodiments of the present disclosure.

FIG. 4 illustrates an example block diagram of the proposed joint Chase decoding and miscorrection avoidance technique, in accordance with certain embodiments of the present disclosure. As illustrated, the Chase decoding of a component codeword in TPC starts at 402 by selecting the least reliable bit (LRB) locations based on the soft information from, for example, NAND flash memory. At 406, a subset of the least reliable bits is selected and flipped, followed by hard decoding of the modified word. At 408, if the hard decoding fails, another subset is selected at 404 and the steps are repeated. If the hard decoding succeeds, at 410, a novel metric $M_{comb}$ is calculated for each of the candidate decoded codewords, as follows:

$$M_{comb}(c,r;h) = \Sigma_{i: c_i \neq h_i} |r_i|, \quad \text{Eqn.(2)}$$

where h is decoded bits at the start of the hard-decoder and it is used as the input to the hard-decoder. In addition, c is the decoded codeword, and r is the soft information from the channel. For example, consider a component codeword with soft-information from the channel r=(+10, −3, +2, −5, +7). If it is the first time these bits are being decoded, h will be the hard-decision on r (e.g., 0, 1, 0, 1, 0). Otherwise, if it is not the first time these bits are being decoded, h could be an arbitrary binary vector whose value depends on the previous decoding attempts. Let us assume that it is the latter case and the second and third bits have been changed by some other component codeword—the current value of h is (0, 0, 1, 1, 0). Suppose when hard-decoding is attempted with this h as input, the decoded codeword c is (0, 0, 0, 0, 1). In this case, $M_{comb}$ is equal to |+2|+|−5|+|+7|=14.

The proposed $M_{comb}$ metric is easier to compute than the Euclidean metric, since it involves fewer terms, which in turn leads to fewer reads from the soft information memory. In addition, the $M_{comb}$ metric does not need the squaring operation, therefore, uses smaller hardware area. At 412, the $M_{comb}$ metric is compared to a pre-determined threshold. In one embodiment, the predetermined threshold may be selected heuristically based on the parameters of the system using simulations. If the $M_{comb}$ metric is smaller than the threshold, the decoder block outputs the candidate decoded codeword as the final decoded codeword. In conventional Chase decoding, each of the flipped patterns are decoded using a BCH hard decoder to generate a list of candidate decoded codewords. A final codeword may then be selected from the list.

The proposed $M_{comb}$ metric is a novel simplification of the optimal Euclidean metric using two assumptions. First, if we assume that no miscorrection has occurred before this Chase decoding attempt (which holds true if miscorrection avoidance procedure works well), the number of non-zero terms in the summation reduce to the size of subset of bits that are flipped in the pattern under consideration and the number of errors corrected by the hard decoder. For example, if number of least reliable bits is equal to 7 bits and the Chase decoder flips 7 bits in a first flipped pattern, and hard decoder flips another t=3 bits in the decoded codeword, the $M_{comb}$ only uses the reliability values corresponding to 7+3=10 bits that are flipped in the decoded codeword. Number of reliability values that are used in $M_{comb}$ metric is much smaller compared to the number of elements used in calculation of Euclidian distance (e.g., N in Eqn. 1). Moreover, in order to calculate the $M_{comb}$ metric, the actual decoded codeword is no longer needed. It should be noted that only the locations of the bits that are changed (e.g., flipped) are used to find the corresponding reliability values and compute the metric $M_{comb}$. In addition, using the $L_1$ distance (sum of absolute values) instead of the $L_2$ distance (sum of square roots) simplifies the hardware required to perform the computations.

As an example, consider a TPC code with BCH constituent codes of length 700 bits and correction capability of t=4 bits. In addition, assume that Chase decoder finds L=12 least reliable bits to generate the flipped patterns. In order to calculate the Euclidian distance, summation should be performed over 700 terms (each of which is generated by a subtraction and square root operation). However, in the $M_{comb}$ metric, the summation is performed over only 12+4 terms (e.g., L+t terms), each of which is the absolute reliability value of the corresponding bit. As can be seen, the proposed metric $M_{comb}$ has much smaller complexity than the original Euclidian distance metric that is used in conventional Chase decoding procedures.

Figure 5:
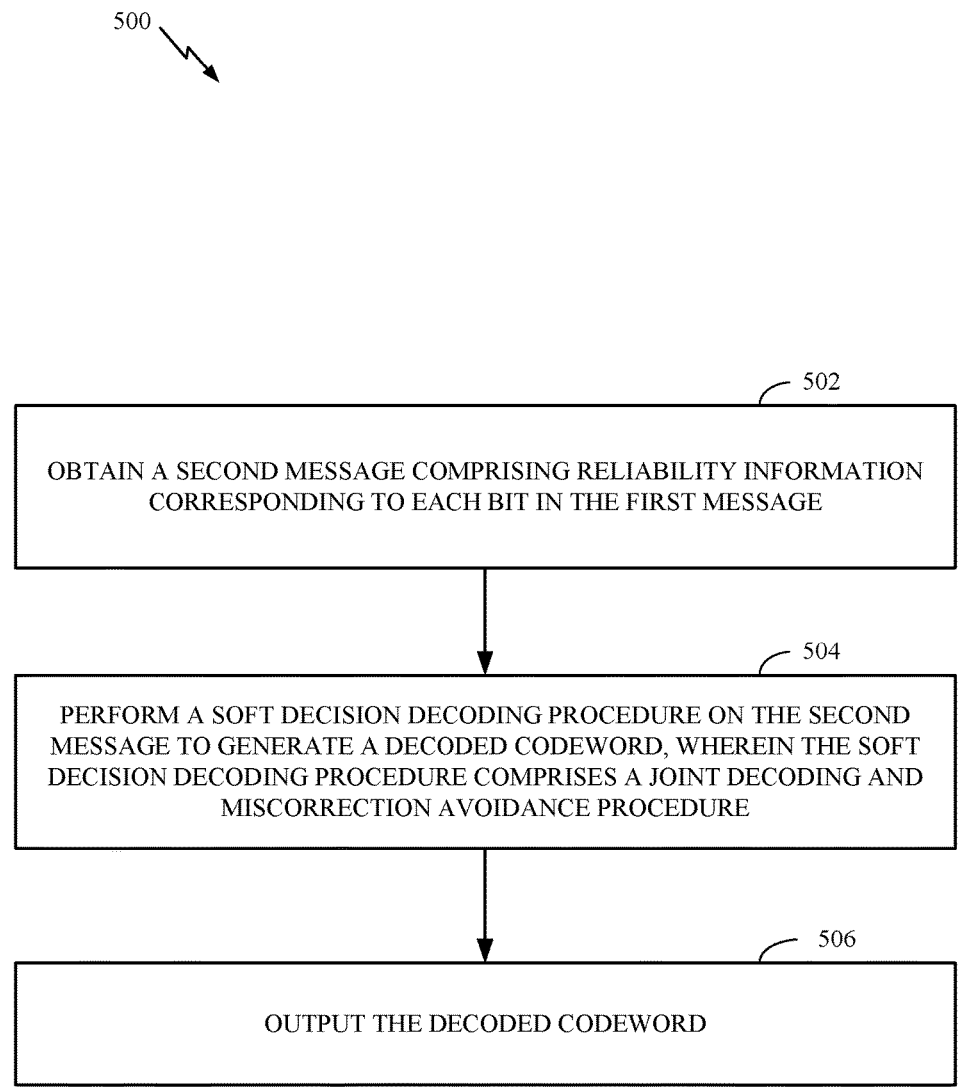
FIG. 5 illustrates example operations that may be performed by a device for decoding a message, in accordance with certain embodiments of the present disclosure.

FIG. 5 illustrates example operations that may be performed by a device for decoding a first message, in accordance with certain embodiments of the present disclosure. At 502, the device obtains a second message comprising reliability information corresponding to each bit in the first message. At 504, the device performs a soft decision decoding procedure on the second message to generate a decoded codeword, wherein the soft decision decoding procedure comprises a joint decoding and miscorrection avoidance procedure. At 506, the device outputs the decoded codeword. In one embodiment, the joint decoding and miscorrection avoidance procedure includes identifying a first plurality of least reliable bits in the first message and generating a plurality of flipped messages using the first message and the identified plurality of least reliable bits. The device may then perform a hard decision decoding procedure on a first one of the plurality of flipped messages to find a first candidate decoded codeword. The device may generate a combined metric for the first candidate codeword. The combined metric is used to jointly select a correct codeword and identify miscorrection in the corresponding codeword. As an example, the combined metric corresponds to a summation of absolute values of a first set of reliability values corresponding to the bits that are flipped in the candidate codeword (as shown in Eqn. (2)). The device may then compare the combined metric to a predetermined threshold to determine whether the first candidate codeword is valid codeword or not.

Figure 6:
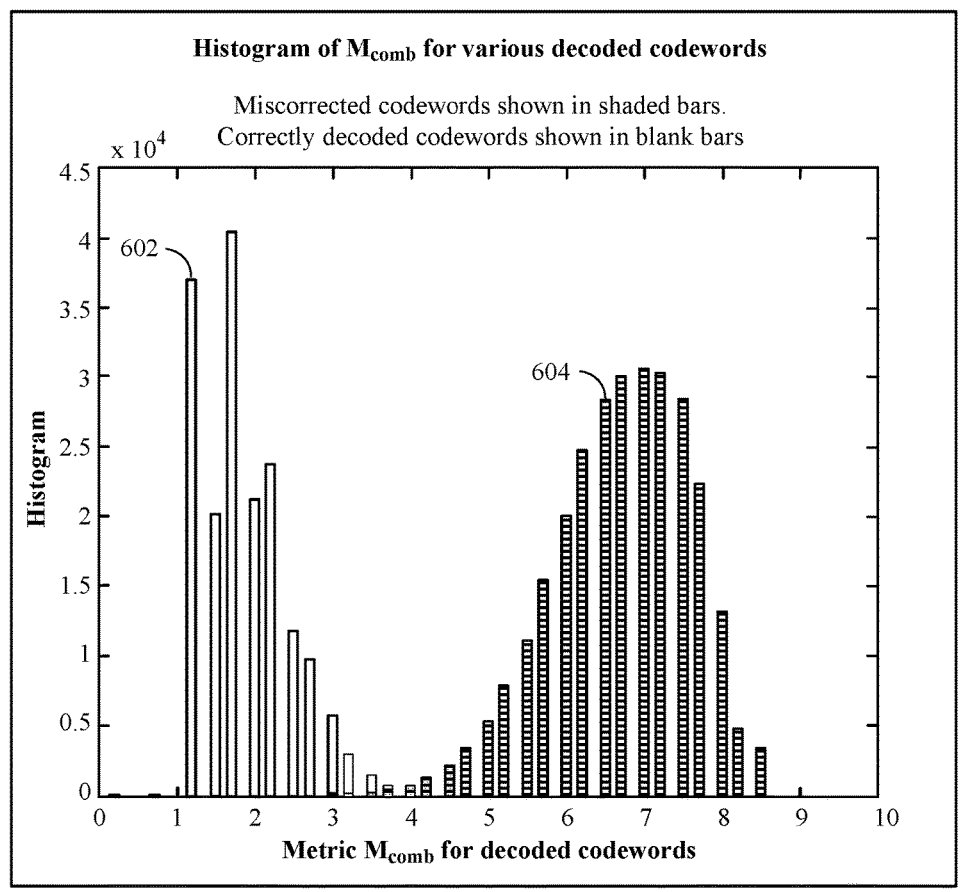
FIG. 6 illustrates an example histogram for the proposed joint Chase decoding and miscorrection avoidance technique for various decoded codewords, in accordance with certain embodiments of the present disclosure.

FIG. 6 illustrates an example histogram for the proposed miscorrection technique for various decoded codewords, in accordance with certain embodiments of the present disclosure. The histogram shows correctly decoded codewords in blank bars and miscorrected codewords in shaded bars using metric $M_{comb}$ defined in Eqn (2). As illustrated, the $M_{comb}$ metric is successfully differentiating between correctly decoded 602 and miscorrected codewords 604. In this example, if the miscorrection threshold is considered to be equal to 3.5, the soft decoder will be able to differentiate between the correct codewords (602) and miscorrected codewords 604 with a very high accuracy. Therefore, the miscorrection metric $M_{comb}$ and joint Chase decoding and miscorrection avoidance method as described herein, is effective in classification of decoded codewords into miscorrections and correctly decoded codewords.

In one embodiment, the proposed decoder enables early termination of the Chase decoder when the first successfully decoded codeword is found. In this case, the decoder does not need to perform hard decoding operations on other flipped bit sequences and is able to stop the process of decoding as soon as the first correct codeword is found. As a result, the proposed joint chase decoding and miscorrection avoidance scheme requires fewer numbers of hard decoding procedures in each Chase decoding attempt. This improves latency of the decoder without the performance loss that is typically associated with early termination. It should be noted that without an effective scheme for miscorrection avoidance, an early termination of Chase might stop at the wrong decoded codeword and therefore other soft decoding algorithms known in the art require that all possible decoded codewords be determined and stored. As seen in FIG. 6, the proposed MAT scheme has very low probability of not detecting a miscorrection. Therefore, the proposed scheme can be used to terminate the Chase decoder when the first decoded codeword that passes the threshold is found. In this way, the decoder avoids testing a large number of flipped subsets. For example, in the example BCH decoder with L=12, there will be $2^{12}$=4096 flipped patterns. If the tenth flipped pattern results in a candidate codeword that is valid, the proposed decoder terminates the soft decoding by declaring that the candidate codeword is a correct codeword without testing the rest of flipped patterns (e.g., 4096−10=4086). In this case, the proposed soft decoder only performs the hard decoding procedures on a small number of flipped patterns (e.g., ten) to find the correct codeword. On the other hand, a conventional Chase decoder, in a similar scenario, needs to perform 4096 hard decoding procedures on all the flipped patterns before selecting one of the candidate decoded codewords to output as the decoded codeword.

Figure 7:
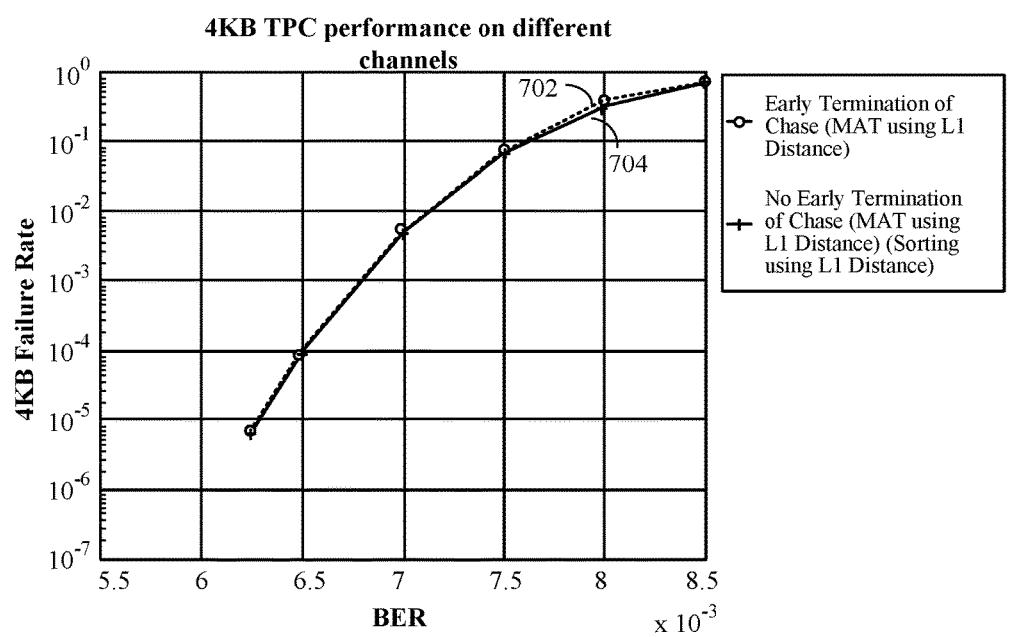
FIG. 7 illustrates an example codeword failure rate of soft decoding of a TPC at different BER values with and without early termination mechanism, in accordance with certain embodiments of the present disclosure.

FIG. 7 illustrates an example codeword failure rate of soft decoding of a TPC at different BER values with and without the proposed early termination method. As illustrated, curve 702 shows failure rate vs. bit error rate for a TPC code with early termination of Chase decoding. Curve 704 shows the failure rate vs. BER for a case without early termination of Chase decoding. As can be seen, early termination of Chase decoding causes no performance loss when the proposed joint Chase-decoding-with-MAT scheme is used. It should be noted that by using early termination, number of subsets that need to be tested in the Chase decoder is significantly reduced. In addition, the proposed early termination method eliminates the need to store the decoded codeword with the least metric.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

Figure 8:
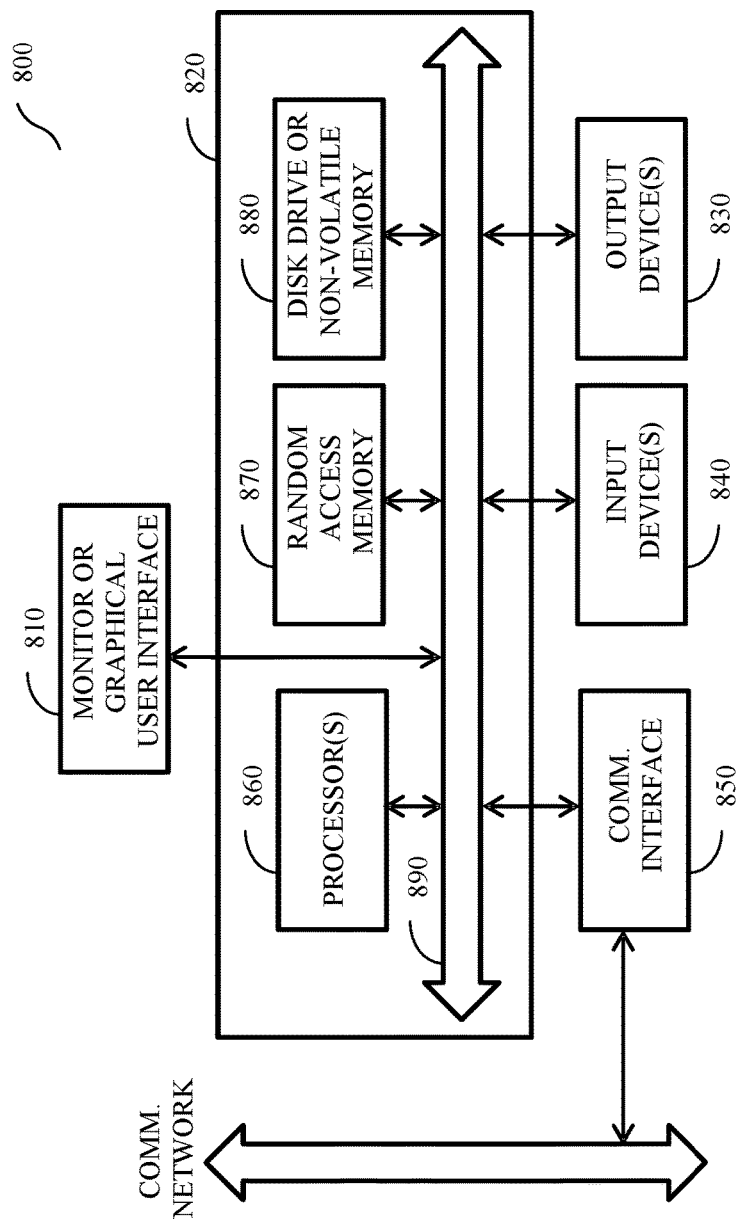
FIG. 8 describes one potential implementation of a device which may be used to decode a TPC codeword, according to one embodiment.

FIG. 8 describes one potential implementation of a device which may be used to decode a codeword, according to certain embodiments. FIG. 8 is merely illustrative of an embodiment incorporating the present invention and does not limit the scope of the invention as recited in the claims. One of ordinary skill in the art would recognize other variations, modifications, and alternatives. In one embodiment, computer system 800 typically includes a monitor 810, a computer 820, user output devices 830, user input devices 840, communications interface 850, and the like.

As shown in FIG. 8, computer 820 may include a processor(s) 860 that communicates with a number of peripheral devices via a bus subsystem 890. These peripheral devices may include user output devices 830, user input devices 840, communications interface 850, and a storage subsystem, such as random access memory (RAM) 870 and disk drive 880.

User input devices 830 include all possible types of devices and mechanisms for inputting information to computer system 820. These may include a keyboard, a keypad, a touch screen incorporated into the display, audio input devices such as voice recognition systems, microphones, and other types of input devices. In various embodiments, user input devices 830 are typically embodied as a computer mouse, a trackball, a track pad, a joystick, wireless remote, drawing tablet, voice command system, eye tracking system, and the like. User input devices 830 typically allow a user to select objects, icons, text and the like that appear on the monitor 810 via a command such as a click of a button or the like.

User output devices 840 include all possible types of devices and mechanisms for outputting information from computer 820. These may include a display (e.g., monitor 810), non-visual displays such as audio output devices, etc.

Communications interface 850 provides an interface to other communication networks and devices. Communications interface 850 may serve as an interface for receiving data from and transmitting data to other systems. Embodiments of communications interface 850 typically include an Ethernet card, a modem (telephone, satellite, cable, ISDN), (asynchronous) digital subscriber line (DSL) unit, FireWire interface, USB interface, and the like. For example, communications interface 850 may be coupled to a computer network, to a FireWire bus, or the like. In other embodiments, communications interfaces 850 may be physically integrated on the motherboard of computer 820, and may be a software program, such as soft DSL, or the like.

In various embodiments, computer system 800 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 820 includes one or more Xeon microprocessors from Intel as processor(s) 860. Further, one embodiment, computer 820 includes a UNIX-based operating system.

RAM 870 and disk drive 880 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 870 and disk drive 880 may be configured to store the basic programming and data constructs that provide the functionality of the present invention.

Software code modules and instructions that provide the functionality of the present invention may be stored in RAM 870 and disk drive 880. These software modules may be executed by processor(s) 860. RAM 870 and disk drive 880 may also provide a repository for storing data used in accordance with the present invention.

RAM 870 and disk drive 880 may include a number of memories including a main random access memory (RAM) for storage of instructions and data during program execution and a read only memory (ROM) in which fixed non-transitory instructions are stored. RAM 870 and disk drive 880 may include a file storage subsystem providing persistent (non-volatile) storage for program and data files. RAM 870 and disk drive 880 may also include removable storage systems, such as removable flash memory.

Bus subsystem 890 provides a mechanism for letting the various components and subsystems of computer 820 communicate with each other as intended. Although bus subsystem 890 is shown schematically as a single bus, alternative embodiments of the bus subsystem may utilize multiple busses.

FIG. 8 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for decoding a first message, the method performed by a device comprising a decoder, and comprising:
obtaining, by the decoder, a second message comprising reliability information corresponding to each bit in the first message;
performing, by the decoder, a soft decision decoding procedure on the second message to generate a decoded codeword, wherein the soft decision decoding procedure comprises a joint decoding and miscorrection avoidance procedure, the joint decoding and miscorrection avoidance procedure comprising generating a combined metric for a first candidate codeword:
wherein the combined metric corresponds to a summation of absolute values of a first set of reliability values corresponding to bits that are flipped in a candidate codeword;
wherein the combined metric does not involve squaring a respective reliability value in the first set of reliability values; and
wherein a number of terms in the summation corresponds to a number of the bits that are flipped in the first candidate codeword including a number of errors corrected by a hard decision decoding procedure; and
outputting the decoded codeword.

2. The method of claim 1, wherein the first message corresponds to a turbo product code codeword comprising at least one Bose-Chaudhuri-Hocquenghem (BCH) constituent code.

3. The method of claim 1, wherein the joint decoding and miscorrection avoidance procedure comprises:
identifying a plurality of least reliable bits in the first message;
generating a plurality of flipped messages using the first message and the identified plurality of least reliable bits; and
performing the hard decision decoding procedure on a first one of the plurality of flipped messages to find the first candidate codeword.

4. The method of claim 3, further comprising:
generating the combined metric for the first candidate codeword; and
comparing the combined metric to a first threshold to determine whether the first candidate codeword is a valid codeword.

5. The method of claim 4, wherein the combined metric is used to jointly select a correct codeword and identify miscorrection in the corresponding codeword.

6. The method of claim 4, further comprising:
performing an early termination of the soft decoding procedure by outputting the first candidate codeword as the decoded codeword as soon as the first valid codeword is found without decoding any of the remaining flipped messages.

7. The method of claim 3, wherein the hard decision decoding procedure is a hard decision Bose-Chaudhuri-Hocquenghem (BCH) decoding procedure.

8. An apparatus for decoding a first message, comprising:
a storage;
a decoder module configured to:
obtain a second message comprising reliability information corresponding to each bit in the first message;
perform a soft decision decoding procedure on the second message to generate a decoded codeword, wherein the soft decision decoding procedure comprises a joint decoding and miscorrection avoidance procedure, wherein:
the joint decoding and miscorrection avoidance procedure comprises generating a combined metric for a first candidate codeword; and
the combined metric has a number of terms corresponding to a number of bits that are flipped in the first candidate codeword including a number of errors corrected by a hard decision decoding procedure; and
output the decoded codeword.

9. The apparatus of claim 8, wherein the first message corresponds to a turbo product code codeword comprising at least one Bose-Chaudhuri-Hocquenghem (BCH) constituent code.

10. The apparatus of claim 8, wherein the at least one processor is further configured to:
identify a plurality of least reliable bits in the first message;
generate a plurality of flipped messages using the first message and the identified plurality of least reliable bits; and
perform the hard decision decoding procedure on a first one of the plurality of flipped messages to find the first candidate codeword.

11. The apparatus of claim 10, wherein the at least one processor is further configured to:
generate the combined metric for the first candidate codeword; and
compare the combined metric to a first threshold to determine whether the first candidate codeword is a valid codeword.

12. The apparatus of claim 11, wherein the combined metric is used to jointly select a correct codeword and identify miscorrection in the corresponding codeword.

13. The apparatus of claim 11, wherein the at least one processor is further configured to:
perform an early termination of the soft decoding procedure by outputting the first candidate codeword as the decoded codeword as soon as the first valid codeword is found without decoding any of the remaining flipped messages.

14. The apparatus of claim 10, wherein the hard decision decoding procedure is a hard decision Bose-Chaudhuri-Hocquenghem (BCH) decoding procedure.

15. A non-transitory processor-readable medium for decoding a first message, comprising processor-readable instructions configured to cause one or more processors to implement a decoder module, the decoder module configured to:
obtain a second message comprising reliability information corresponding to each bit in the first message;
perform a soft decision decoding procedure on the second message to generate a decoded codeword, wherein the soft decision decoding procedure comprises a joint decoding and miscorrection avoidance procedure, the joint decoding and miscorrection avoidance procedure comprising generating a combined metric for a first candidate codeword:
wherein the combined metric corresponds to a piecewise combination of first-order polynomials in a first set of reliability values corresponding to bits that are flipped in a candidate codeword; and
output the decoded codeword.

16. The processor-readable medium of claim 15, wherein the first message corresponds to a turbo product code codeword comprising at least one Bose-Chaudhuri-Hocquenghem (BCH) constituent code.

17. The processor-readable medium of claim 15, wherein the processor-readable instructions are further configured to cause the one or more processors to:
identify a plurality of least reliable bits in the first message;
generate a plurality of flipped messages using the first message and the identified plurality of least reliable bits; and
perform a hard decision decoding procedure on a first one of the plurality of flipped messages to find the first candidate codeword.

18. The processor-readable medium of claim 17, wherein the processor-readable instructions are further configured to cause the one or more processors to:
generate the combined metric for the first candidate codeword; and
compare the combined metric to a first threshold to determine whether the first candidate codeword is a valid codeword.

19. The processor-readable medium of claim 18, wherein the combined metric is used to jointly select a correct codeword and identify miscorrection in the corresponding codeword.

20. The processor-readable medium of claim 18, wherein the processor-readable instructions are further configured to cause the one or more processors to:
perform an early termination of the soft decoding procedure by outputting the first candidate codeword as the decoded codeword as soon as the first valid codeword is found without decoding any of the remaining flipped messages.

* * * * *